United States Patent
Lin et al.

(10) Patent No.: US 10,446,508 B2
(45) Date of Patent: Oct. 15, 2019

(54) SEMICONDUCTOR PACKAGE INTEGRATED WITH MEMORY DIE

(71) Applicant: MEDIATEK INC., Hsin-Chu (TW)

(72) Inventors: Sheng-Mou Lin, Hsin-Chu (TW); Chih-Chun Hsu, Hsin-Chu (TW); Wen-Chou Wu, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 60 days.

(21) Appl. No.: 15/682,908

(22) Filed: Aug. 22, 2017

(65) Prior Publication Data
US 2018/0061786 A1   Mar. 1, 2018

Related U.S. Application Data

(60) Provisional application No. 62/382,285, filed on Sep. 1, 2016.

(51) Int. Cl.
| | |
|---|---|
| *H01L 23/66* | (2006.01) |
| *H01L 23/64* | (2006.01) |
| *H01L 23/552* | (2006.01) |
| *H01L 25/065* | (2006.01) |
| *H01L 25/18* | (2006.01) |

(52) U.S. Cl.
CPC ........... *H01L 23/66* (2013.01); *H01L 23/552* (2013.01); *H01L 23/645* (2013.01); *H01L 25/0657* (2013.01); *H01L 25/18* (2013.01); *H01L 2223/6605* (2013.01); *H01L 2225/06527* (2013.01); *H01L 2225/06537* (2013.01); *H01L 2225/06562* (2013.01); *H01L 2225/06572* (2013.01)

(58) Field of Classification Search
None
See application file for complete search history.

(56) References Cited

U.S. PATENT DOCUMENTS

| | | | |
|---|---|---|---|
| 2008/0072025 A1* | 3/2008 | Staszewski | G06F 9/30032 712/241 |
| 2009/0057864 A1* | 3/2009 | Choi | H01L 24/81 257/686 |

(Continued)

FOREIGN PATENT DOCUMENTS

| | | |
|---|---|---|
| CN | 101834177 A | 9/2010 |
| JP | 2004-165269 A | 6/2004 |

*Primary Examiner* — Charles D Garber
*Assistant Examiner* — Xiaoming Liu
(74) *Attorney, Agent, or Firm* — McClure, Qualey & Rodack, LLP

(57) ABSTRACT

A semiconductor package structure is provided. The semiconductor package structure includes a package substrate. An integrated circuit (IC) die having a radio frequency (RF) circuit and a memory die are stacked over the package substrate. The memory die entirely covers a first surface portion of the package substrate to define a second surface portion of the package substrate exposed from the memory die, and the IC die partially covers the first surface portion and the second surface portion of the package substrate. The RF circuit includes a first sensitive device region corresponding to the second surface portion of the package substrate and a second sensitive device region corresponding to the first surface portion of the package substrate and offsetting a memory input/output (I/O) electrical path of the memory die, as viewed from a top-view perspective.

28 Claims, 7 Drawing Sheets

(56) References Cited

U.S. PATENT DOCUMENTS

| | | |
|---|---|---|
| 2009/0315167 A1 | 12/2009 | Sasaki et al. |
| 2010/0213585 A1 | 8/2010 | Usami |
| 2010/0265024 A1* | 10/2010 | Nakashiba .............. H01L 23/48 |
| | | 336/200 |
| 2015/0137338 A1* | 5/2015 | Lin ................... H01L 23/49816 |
| | | 257/676 |
| 2015/0194944 A1* | 7/2015 | Joshi .................... H04B 1/0458 |
| | | 327/551 |

* cited by examiner

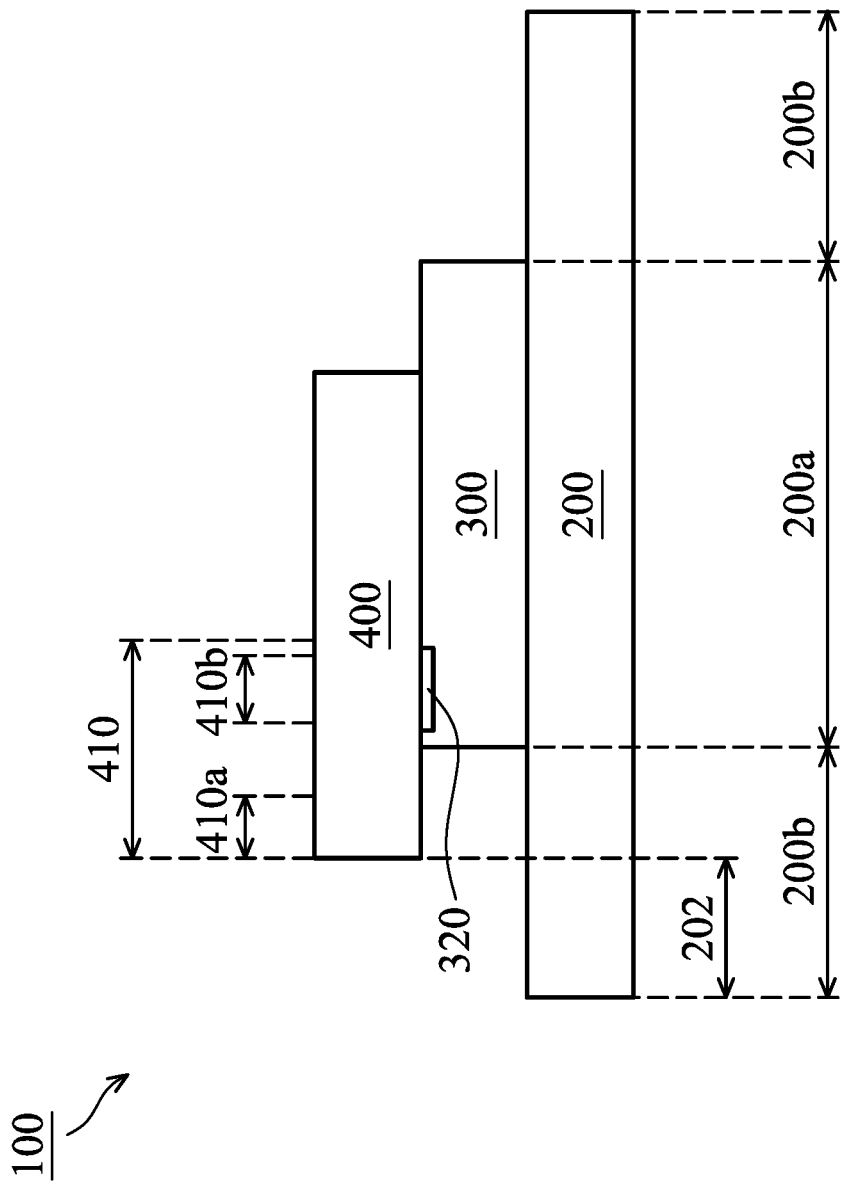

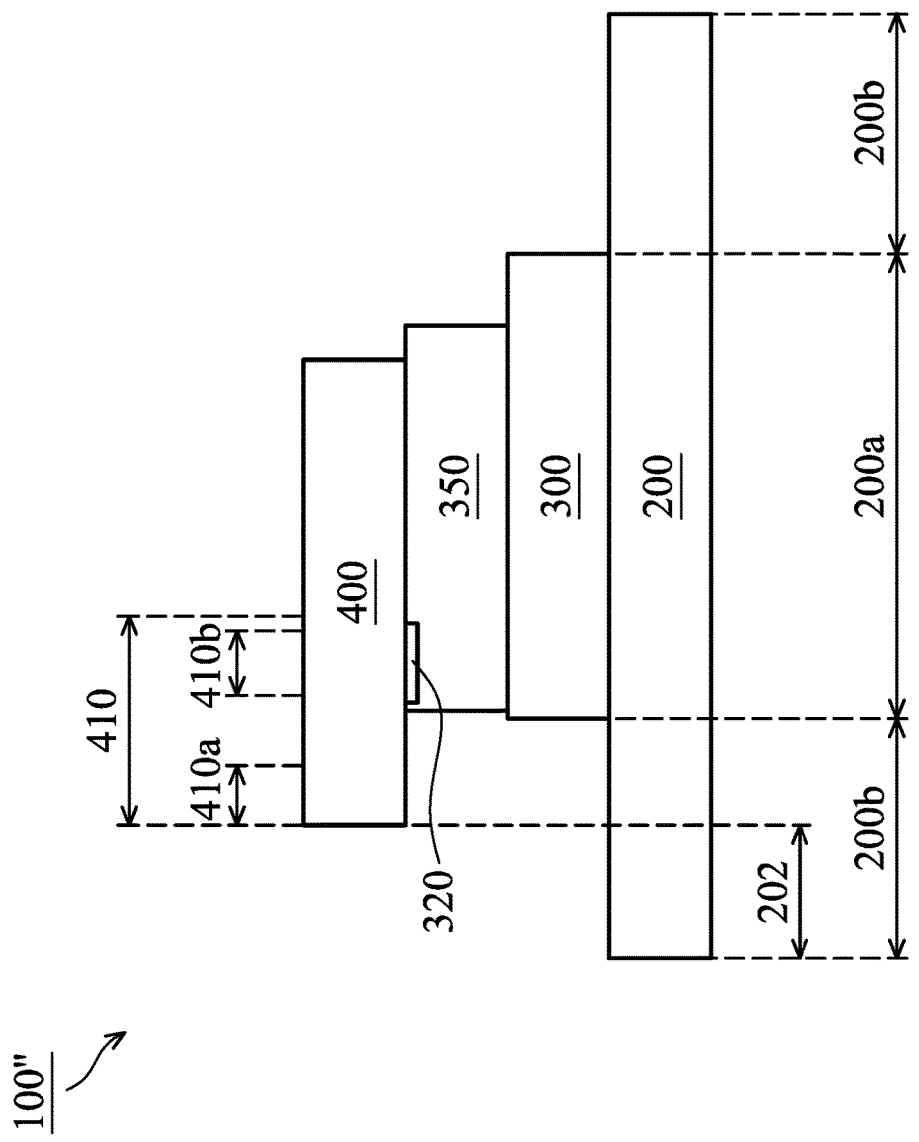

SEMICONDUCTOR PACKAGE INTEGRATED WITH MEMORY DIE

CROSS REFERENCE TO RELATED APPLICATIONS

This application claims the benefit of U.S. Provisional Application No. 62/382,285 filed on Sep. 1, 2016, the entirety of which is incorporated by reference herein.

BACKGROUND OF THE INVENTION

Field of the Invention

The present invention relates to semiconductor packaging technology, and in particular to a memory die integrated into a semiconductor package structure having a radio frequency (RF) function.

Description of the Related Art

In recent years, as electronic products have become increasingly multifunctional and have been scaled down in size, there is a desire for manufacturers of semiconductor devices to make more devices formed in a single semiconductor package, so that the electronic products that employ these devices can provide several advantages in terms of cost, size, performance, and product-design flexibility.

Response to this desire has been the development of stacked-die packaging technology. Stacked-die packaging technology enables two or more dies with different functions to be installed atop one another, i.e. stacked. This allows higher component density in electronic products, such as mobile phones, personal digital assistants (PDAs), and digital cameras.

Such electronic products are also provided with wireless communications capabilities. For achieving the function of wireless communications, a communication module (e.g., an IC package with radio frequency (RF) devices) is typically required.

However, some problems may occur while manufacturing the semiconductor package utilizing the stacked-die packaging technology. For example, as a semiconductor memory die is integrated into a semiconductor package with a RF function by the stacked-die packaging technology, RF desense (i.e., degradation of sensitivity) may easily occur due to undesired signal coupling between the semiconductor memory die and the sensitive RF device (such as RF transmitter (TX), RF receiver (RX), RF synthesizer (SX), RF balun or RF inductor) or RF routing in different parts of the semiconductor package or in another die (e.g., SoC (system-on-chip) die). This problem can result in a degradation of RF performance. Thus, a novel semiconductor package structure is desirable.

BRIEF SUMMARY OF THE INVENTION

Semiconductor package structures are provided. An exemplary embodiment of a semiconductor package structure includes a package substrate. An integrated circuit (IC) die has a radio frequency (RF) circuit and a memory die stacked over the package substrate. The memory die entirely covers a first surface portion of the package substrate to define a second surface portion of the package substrate exposed from the memory die and the IC die partially covers the first surface portion and the second surface portion of the package substrate. The RF circuit includes a first sensitive device region corresponding to the second surface portion of the package substrate and a second sensitive device region corresponding to the first surface portion of the package substrate and offsetting a memory input/output (I/O) electrical path of the memory die, as viewed from a top-view perspective.

Another exemplary embodiment of a semiconductor package structure includes a package substrate. An IC die having a RF circuit and a memory die stacked over the package substrate. The memory die is disposed over the IC die and the memory die has a memory I/O electrical path. The RF circuit includes a first sensitive device region corresponding to a second surface portion of the package substrate and a second sensitive device region corresponding to a first surface portion of the package substrate and offsetting the memory I/O electrical path of the memory die, as viewed from a top-view perspective.

Yet another exemplary embodiment of a semiconductor package structure includes a package substrate. An IC die has a RF circuit and a memory die stacked over the package substrate. The IC die is disposed over the memory die and the memory die has a memory I/O electrical path. The RF circuit includes a first sensitive device region corresponding to a second surface portion of the package substrate and a second sensitive device region corresponding to a first surface portion of the package substrate and offsetting the memory I/O electrical path of the memory die, as viewed from a top-view perspective.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2A is a cross-sectional view of an exemplary semiconductor package structure shown in FIG. 1.

FIG. 2C is a cross-sectional view of an exemplary semiconductor package structure in accordance with some embodiments of the disclosure.

DETAILED DESCRIPTION OF THE INVENTION

Figure 1:
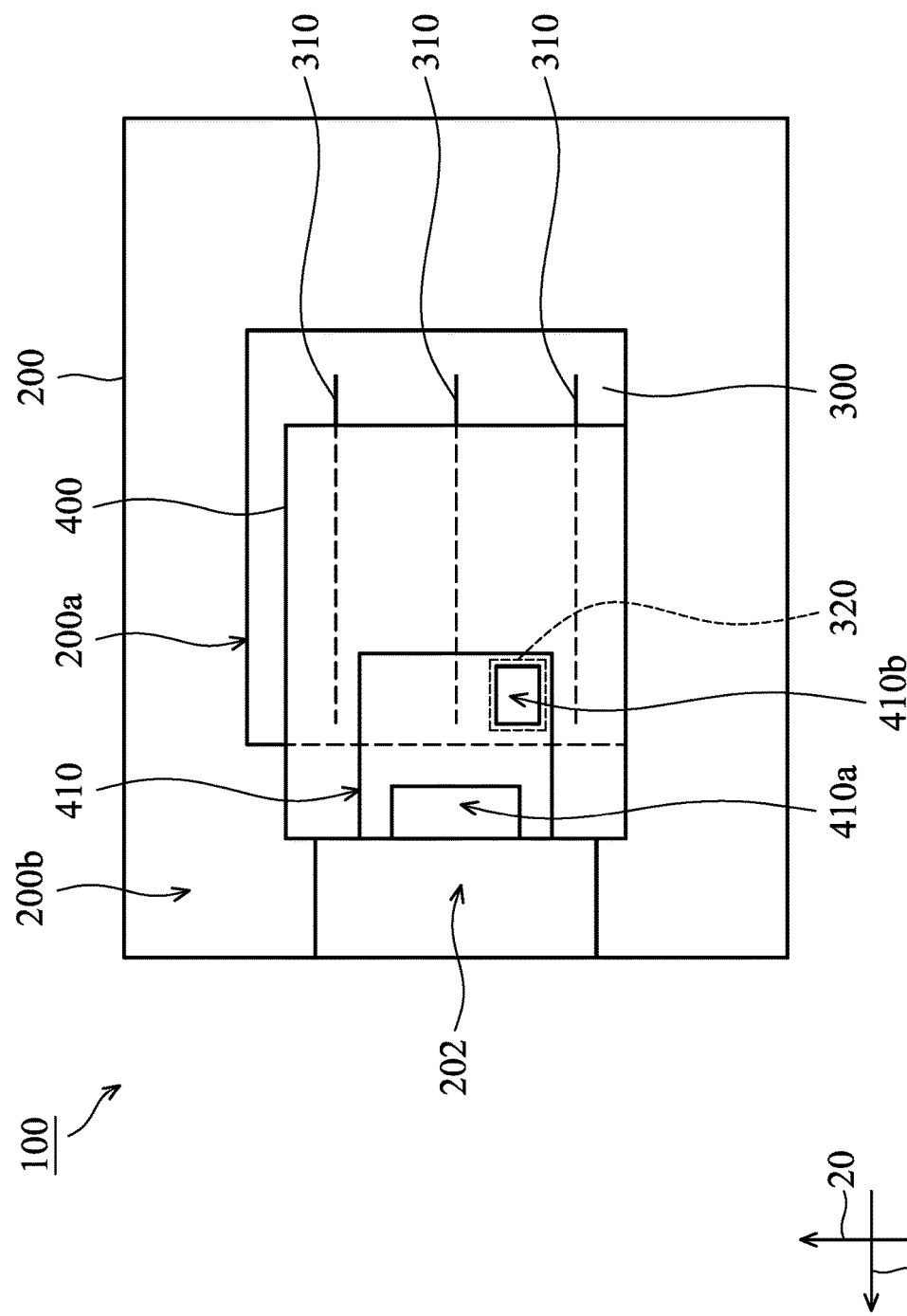
FIG. 1 is a plan view of an exemplary semiconductor package structure in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Refer to FIGS. 1 and 2A, in which FIG. 1 is a plan view of an exemplary semiconductor package structure 100 in accordance with some embodiments of the disclosure, and FIG. 2A is a cross-sectional view of an exemplary semiconductor package structure 100 shown in FIG. 1. In some embodiments, the semiconductor package structure 100 is a semiconductor package structure using a flip-chip technology, a wire-bonding technology, or a combination thereof. Moreover, the semiconductor package structure 100 may be a system in package (SiP) package with an integrated radio frequency (RF) circuit.

As shown in FIGS. 1 and 2A, in some embodiments, the semiconductor package structure 100 includes a package substrate 200. The package substrate 200 may be mounted on a base (not shown). For example, the base may include a printed circuit board (PCB) and may be formed of polypropylene (PP). Moreover, the package substrate 200 may be mounted on a base (not shown) by a bonding process. The package substrate 200 may include conductive structures (not shown) that are mounted on and electrically coupled to the base by a bonding process. In some embodiments, the conductive structures, includes a conductive bump structure (such as a copper or solder bump structure), a conductive pillar structure, a conductive wire structure or a conductive paste structure.

In some embodiments, the semiconductor package structure 100 may include a system-on-chip (SOC) die including a RF circuit and a memory die in a stacking arrangement. For example, the semiconductor package structure 100 includes a memory die 300 and an integrated circuit (IC) die 400 (such as a SOC die) having a RF circuit 410 which are successively and vertically stacked over the package substrate 200 by a bonding process using respective conductive structures (not shown). The conductive structure may include a conductive bump structure (such as a copper or solder bump structure), a conductive pillar structure, a conductive wire structure or a conductive paste structure.

The memory die 300, for example, may include a random access memory (RAM) die. Moreover, the SOC die, for example, may include a logic die including a central processing unit (CPU), a graphics processing unit (GPU), a RAM controller or any combination thereof. It should be noted that the number of dies integrated in the semiconductor package structure 100 is not limited to that disclosed in the embodiment.

As shown in FIG. 1, the memory die 300 entirely covers a first surface portion 200a of the package substrate 200 so as to define a second surface portion 200b of the package substrate 200 that is exposed from the memory die 300. Namely, as viewed from a top-view perspective, the memory die 300 has a projection on the package substrate 200 without overlapping the second surface portion 200b of the package substrate 200. Furthermore, the first surface portion 200a of the package substrate 200 may includes the routing on the substrate.

Moreover, the IC die 400 stacked on the memory die 300 partially covers the first surface portion 200a and the second surface 200b portion of the package substrate 200, so that the IC die 400 offsets the underlying memory die 300 along a predetermined direction. In some embodiments, the IC die 400 offsets the underlying memory die 300 along a first direction 10, so that the IC die 400 has an edge that is aligned to an edge of the memory die 300, as shown in FIG. 1. In some embodiments, the IC die 400 offsets the underlying memory die 300 along a second direction 20 that is perpendicular to the first direction 10, so that the IC die 400 has an edge that is aligned to an edge of the memory die 300. Alternatively, the IC die 400 offsets the underlying memory die 300 along the first direction 10 and the second direction 20, so that the edges of the IC die 400 do not be aligned to edges of the memory die 300.

As shown in FIGS. 1 and 2A, the RF circuit 410 of the IC die 400 includes a first sensitive device region 410a and second sensitive device region 410b. In some embodiments, the first sensitive device region 410a and the second sensitive device region 410b may each include one or more RF devices, such as RF transmitters (TXs), RF receivers (RXs), RF synthesizers (SXs), RF baluns, and RF inductors. In some embodiments, as viewed from a top-view perspective, the first sensitive device region 410a is located at a region of the RF circuit 410 corresponding to the second surface portion 200b of the package substrate 200. Moreover, as viewed from a top-view perspective, the second sensitive device region 410b is located at another region of the RF circuit 410 corresponding to the first surface portion 200a of the package substrate 200 and offsetting a memory input/output (I/O) electrical path of the memory die 300 (which is also referred to as a memory signal loop). In some embodiments, the memory I/O electrical path at least includes one or more redistribution layers (RDLs) 310. Although FIG. 1 shows three RDLs 310 and the RDLs 310 are in a straight line arrangement and parallel to each other, it should be noted that the number and the arrangement of RDLs formed in the memory die is not limited to that disclosed in the embodiment and may be varied based on the design demands.

In some embodiments, the memory die 300 further includes an optional metal plate 320 disposed at a region of the memory die 300 directly below the second sensitive device region 410b. The area of the metal plate 320 may be larger than that of the second sensitive device region 410b. Moreover, the metal plate 320 and the RDLs 310 may be formed by patterning the same conductive layer. In some embodiments, the metal plate 320 is electrical isolated from the I/O electrical path of the memory die 300 and electrically connected to ground.

Alternatively, as viewed from a top-view perspective, the second sensitive device region 410b may be located at a region of the RF circuit 410 corresponding to the first surface portion 200a and the second surface portion 200b of the package substrate 200 and offsetting the memory I/O electrical path (e.g., the RDLs 310). Moreover, as viewed from a top-view perspective, the second sensitive device region 410b is spaced apart from the first sensitive device region 410a.

In some embodiments, the first sensitive device region 410a includes a circuit having one or more RF transmitters and one or more RF receivers and the second sensitive device region 410b includes one or more RF synthesizers. In these cases, the first sensitive device region 410a may also include one or more RF baluns and the second sensitive device region may also include includes one or more RF inductors.

In some embodiments, the first sensitive device region 410a includes a circuit having one or more RF synthesizers and one or more RF receivers and the second sensitive device region 410b includes one or more RF transmitters. In these cases, the first sensitive device region 410a may also include one or more RF inductors and the second sensitive device region may also include includes one or more RF baluns.

In some embodiments, the first sensitive device region 410a includes a circuit having one or more RF receivers and the second sensitive device region 410b includes one or more RF transmitters and one or more RF synthesizers. In these cases, the second sensitive device region may also include one or more RF inductors and one or more RF baluns.

Alternatively, the first sensitive device region 410a includes a circuit having one or more RF receivers, one or more RF transmitters, and one or more RF synthesizers.

As shown in FIGS. 1 and 2A, in some embodiments, as viewed from a top-view perspective, the second surface portion 200b of the package substrate 200 has an interconnect region 202 located adjacent to an edge of the package substrate 200. The interconnect region 202 provides an electrically connection between the conductive structures (not shown) of the package substrate 200 and the first and second sensitive device regions 410a and 410b of the RF circuit 410, in which these conductive structures are mounted on and electrically coupled to the base (not shown). Accordingly, the interconnect region 202 and the first and second sensitive device regions 410a and 410b of the RF circuit 410 construct a RF sensitive signal loop, which does not overlap with the memory signal loop (i.e., the I/O electrical path of the memory die 300) as viewed from a top-view perspective.

In some embodiments, as viewed from a top-view perspective, the first sensitive device region 410a of the RF circuit 410 is located between the interconnect region 202 and the memory die 300, as shown in FIG. 1. Alternatively, as viewed from a top-view perspective, at least a portion of the interconnect region 202 is covered by the first sensitive device region 410a.

In some embodiments, the semiconductor package structure 100 may include an encapsulating layer (not shown), such as a molding compound, disposed on the package substrate 200 and surrounding the memory die 300 and the overlying IC die 400. In some embodiments, the molding compound may be formed of an epoxy, a resin, a moldable polymer, or the like.

In some other embodiments, the package substrate 200 may be equipped with a RF die (not shown). In those cases, the IC die 400 does not have the RF circuit 410 including the first sensitive device region 410a and second sensitive device region 410b. Moreover, the RF die may include the RF circuit 410. The RF die is disposed on the second surface portion 200b of the package substrate 200 that is exposed from the memory die 300. Namely, as viewed from a top-view perspective, the memory die 300 has a projection on the package substrate 200 without overlapping with the RF die. In more detail, in some embodiments, the first sensitive device region 410a and the second sensitive device region 410b are located at the region of the RF circuit 410 corresponding to the second surface portion 200b of the package substrate 200. In some embodiments, as viewed from a top-view perspective, the RF die is located between the interconnect region 202 and the memory die 300. Alternatively, as viewed from a top-view perspective, at least a portion of the interconnect region 202 is covered by the first sensitive device region 410a of the RF die.

Figure 2B:
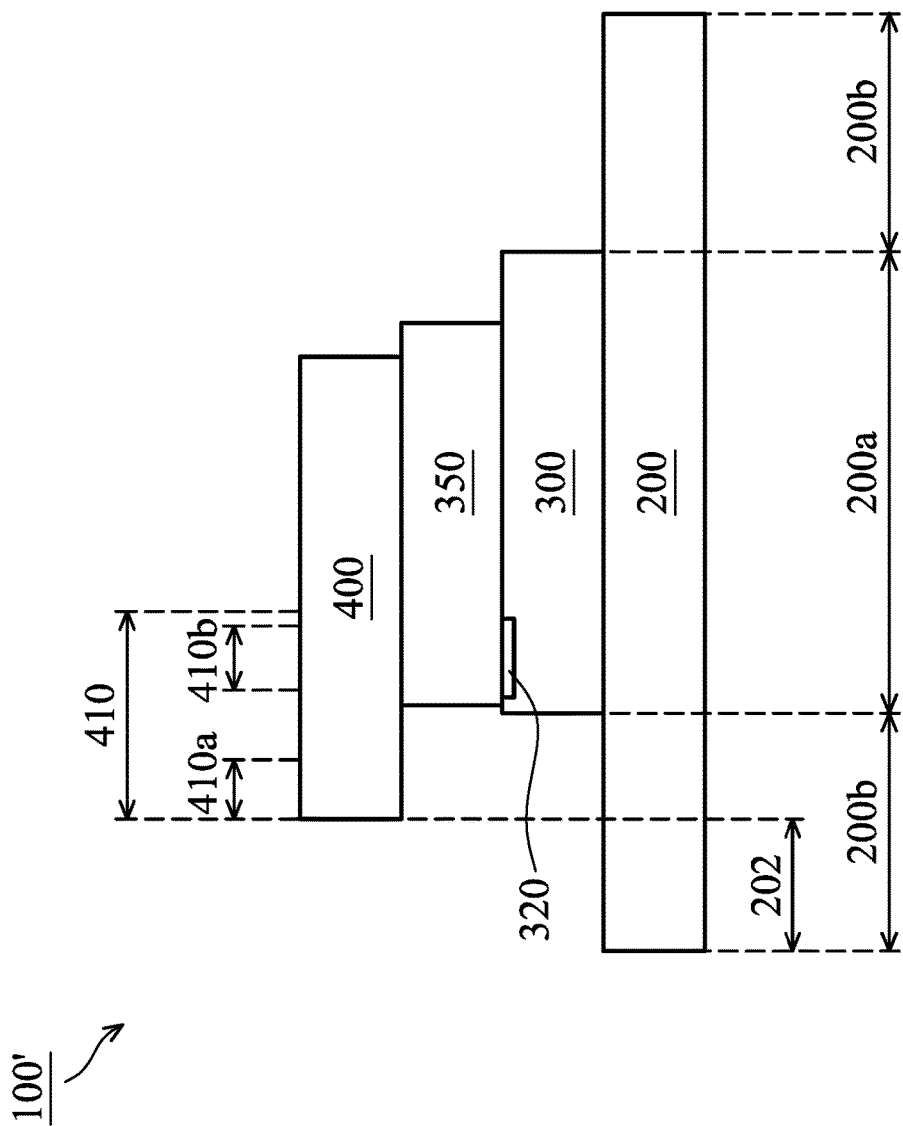
FIG. 2B is a cross-sectional view of an exemplary semiconductor package structure in accordance with some embodiments of the disclosure.

FIG. 2B illustrates a cross-sectional view of an exemplary semiconductor package structure 100' in accordance with some embodiments of the disclosure. Descriptions of elements of the embodiments hereinafter that are the same as or similar to those previously described with reference to FIGS. 1 and 2A may be omitted for brevity. In the embodiment, the semiconductor package structure 100' is similar to the semiconductor package structure 100 shown in FIGS. 1 and 2A. Compared to the semiconductor package structure 100, the semiconductor package structure 100' further includes a spacer 350 interposed between the IC die 400 and the memory die 300, as shown in FIG. 2B.

In some embodiments, the spacer 350 is a dummy die and there is not any passive component, active component, or circuit. Moreover, the edges of the memory die 300 are not aligned to the edges of the spacer 350 and the edges of the IC die 400 are also not aligned to the edges of the spacer 350, as shown in FIG. 2B. For example, the edges of the memory die 300 laterally protrude from the edges of the spacer 350. As a result, the memory die 300 may provide space for bonding wires (not shown).

Alternatively, an edge of the spacer 350 may be aligned to an edge of the memory die 300 or an edge of the IC die 400. It should be noted that the planar arrangement of the spacer 350 is not limited to that disclosed in the embodiment.

In some embodiments, the spacer 350 may be a die having an RDL structure (not shown) that is coupled between the IC die 400 and the memory die 300. The RDL structure may be referred to as a fan-out structure. In some embodiments, the RDL structure includes one or more conductive traces disposed in an inter-metal dielectric (IMD) layer. For example, the conductive traces may be disposed at multiple levels of the IMD layer. In some embodiments, the IMD layer may be a single layer or a multi-layer structure. Moreover, the IMD layer may be formed of organic materials, which include a polymer base material, non-organic materials, which include silicon nitride ($SiN_x$), silicon oxide ($SiO_x$), graphene, or the like.

In some other embodiments, the IMD layer is a high-k dielectric layer (k is the dielectric constant of the dielectric layer). Alternatively, the IMD layer may be formed of a photo sensitive material, which includes a dry film photoresist, or a taping film.

In some embodiments, the semiconductor package structure 100' may include an encapsulating layer (not shown), such as a molding compound, disposed on the package substrate 200 and surrounding the memory die 300, the spacer 350, and the overlying IC die 400.

FIG. 2C illustrates a cross-sectional view of an exemplary semiconductor package structure 100" in accordance with some embodiments of the disclosure. Descriptions of elements of the embodiments hereinafter that are the same as or similar to those previously described with reference to FIGS. 1 and 2A or FIG. 2B may be omitted for brevity. In the embodiment, the semiconductor package structure 100" is similar to the semiconductor package structure 100' shown in FIG. 2B. Compared to the semiconductor package structure 100', the memory die 300 in the semiconductor package structure 100" does not have the metal plate 320. Moreover, the spacer 350 in the semiconductor package structure 100" is a dummy die and includes the optional metal plate 320 at a region of the spacer 350 directly below the second sensitive device region 410b. The area of the metal plate 320 may be larger than that of the second sensitive device region 410b. In some embodiments, the metal plate 320 is electrically connected to ground.

Figure 3:
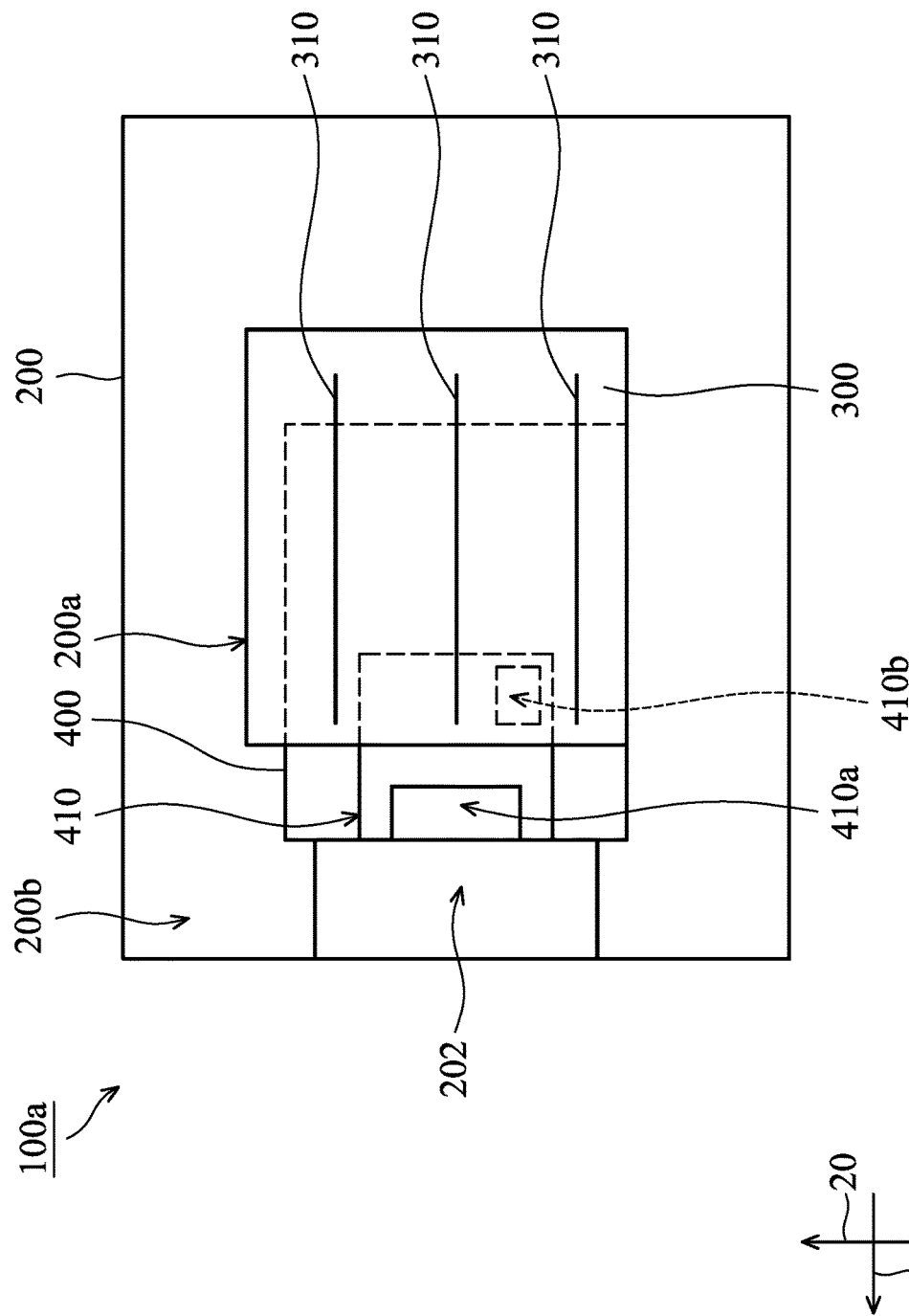
FIG. 3 is a plan view of an exemplary semiconductor package structure in accordance with some embodiments of the disclosure.
Figure 4A:
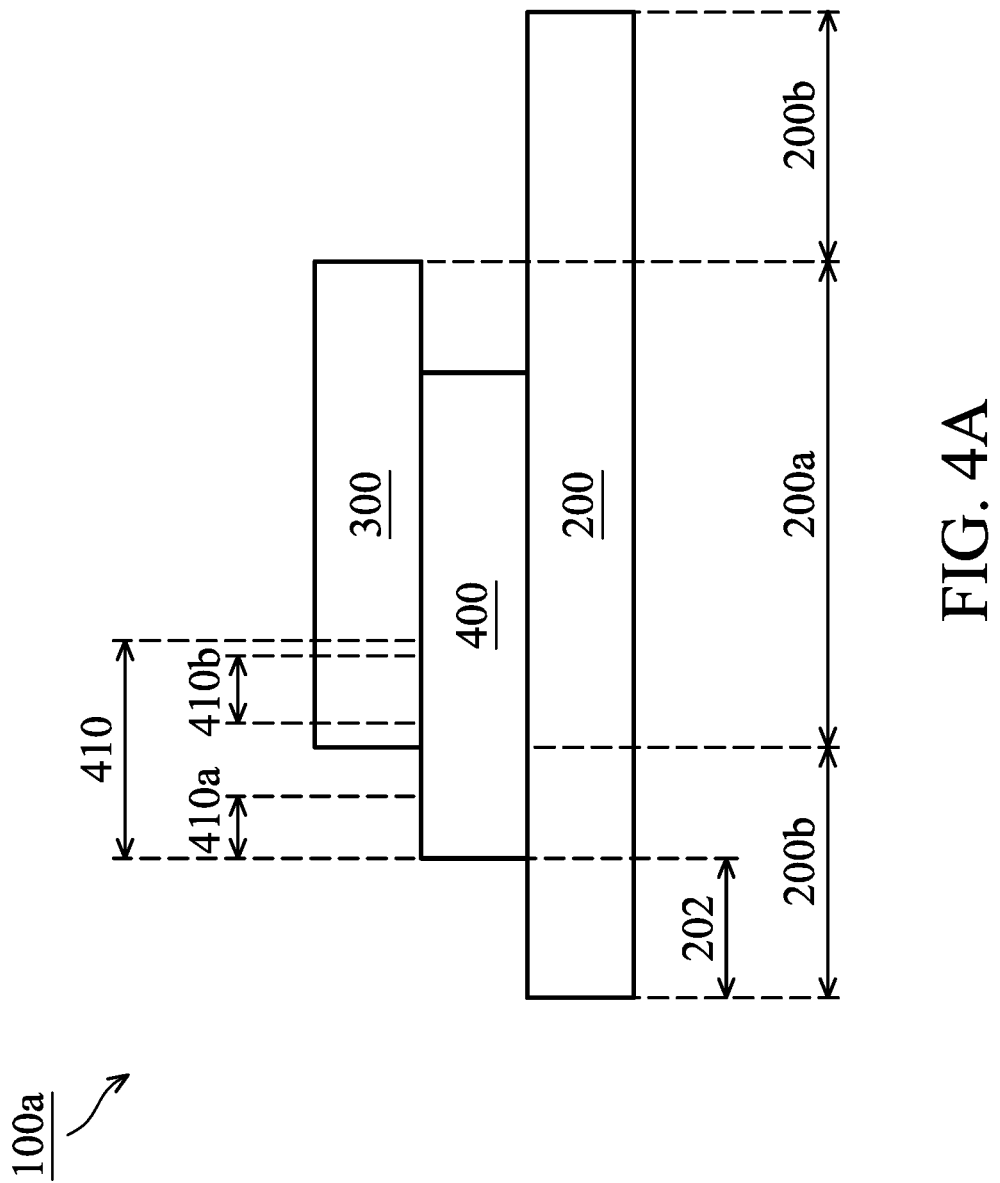
FIG. 4A is a cross-sectional view of an exemplary semiconductor package structure shown in FIG. 3.

Refer to FIGS. 3 and 4A, in which FIG. 3 is a plan view of an exemplary semiconductor package structure 100a in accordance with some embodiments of the disclosure, and FIG. 4A is a cross-sectional view of an exemplary semiconductor package structure 100a shown in FIG. 3. Descriptions of elements of the embodiments hereinafter that are the same as or similar to those previously described with reference to FIGS. 1 and 2A may be omitted for brevity. In the embodiment, the semiconductor package structure 100a is similar to the semiconductor package structure 100 shown in FIGS. 1 and 2A. In some embodiments, the semiconductor package structure 100a is a semiconductor package structure using a flip-chip technology, a wire-bonding technology, or a combination thereof. Moreover, the semiconductor package structure 100a may be a system in package (SiP) package with an integrated & radio frequency (RF) circuit. Similarly, the package substrate 200 of the semiconductor package structure 100a may be mounted on a base (not shown) that may include a PCB.

Unlike the semiconductor package structure 100, an IC die 400 (such as a SOC die) and a memory die 300 in the semiconductor package structure 100a are successively and vertically stacked over the package substrate 200, as shown in FIG. 4A. Moreover, the memory die 300 may not have the metal plate 320.

The memory die 300, for example, may include a random access memory (RAM) die. Moreover, the SOC die, for example, may include a logic die including a central processing unit (CPU), a graphics processing unit (GPU), a RAM controller or any combination thereof. It should be noted that the number of dies integrated in the semiconductor package structure 100 is not limited to that disclosed in the embodiment.

As shown in FIG. 3, as viewed from a top-view perspective, the memory die 300 overlying the IC die 400 entirely covers a first surface portion 200a of the package substrate 200 so as to define a second surface portion 200b of the package substrate 200 that is exposed from the memory die 300. Moreover, the IC die 400 underlying the memory die 300 partially covers the first surface portion 200a and the second surface 200b portion of the package substrate 200, so that the IC die 400 offsets the overlying memory die 300 along a predetermined direction. For example, the IC die 400 offsets the overlying memory die 300 along a first direction 10, so that the IC die 400 has an edge that is aligned to an edge of the memory die 300, as shown in FIG. 3. In some embodiments, the IC die 400 offsets the overlying memory die 300 along a second direction 20 that is perpendicular to the first direction 10, so that the IC die 400 has an edge that is aligned to an edge of the memory die 300. Alternatively, the IC die 400 offsets the overlying memory die 300 along the first direction 10 and the second direction 20, so that the edges of the IC die 400 do not be aligned to edges of the memory die 300.

In some other embodiments, the package substrate 200 may be equipped with a RF die (not shown). In those cases, the IC die 400 may be entirely within the first surface portion 200a of the package substrate 200, so as to be entirely covered by the overlying memory die 300. Moreover, the IC die 400 does not have the RF circuit 410 including the first sensitive device region 410a and second sensitive device region 410b. The RF die may include the RF circuit 410. The RF die is disposed on the second surface portion 200b of the package substrate 200 that is exposed from the memory die 300. Namely, as viewed from a top-view perspective, the memory die 300 has a projection on the package substrate 200 without overlapping with the RF die. In more detail, in some embodiments, the first sensitive device region 410a and the second sensitive device region 410b are located at the region of the RF circuit 410 corresponding to the second surface portion 200b of the package substrate 200. In some embodiments, as viewed from a top-view perspective, the RF die is located between the interconnect region 202 and the memory die 300. In some other embodiments, as viewed from a top-view perspective, at least a portion of the interconnect region 202 is covered by the first sensitive device region 410a of the RF die.

Figure 4B:
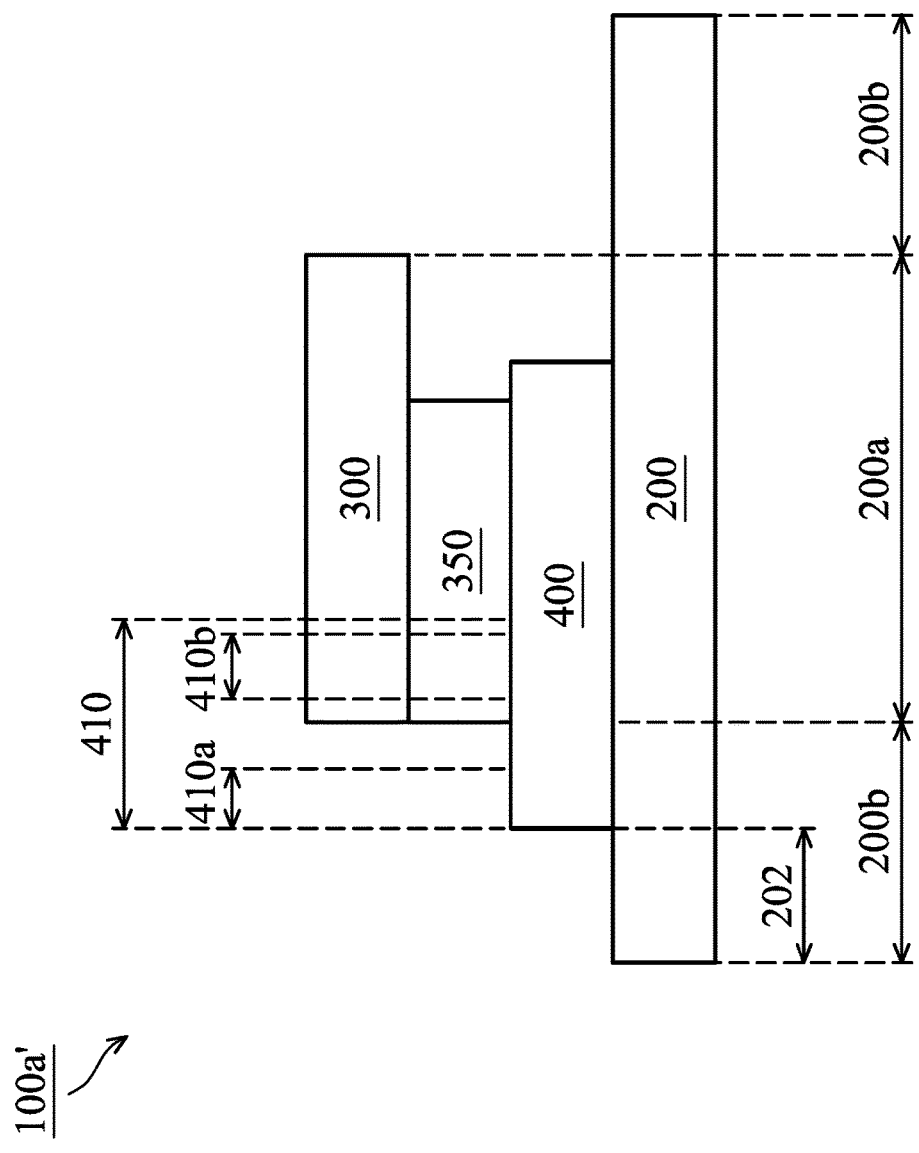
FIG. 4B is a cross-sectional view of an exemplary semiconductor package structure in accordance with some embodiments of the disclosure.

FIG. 4B illustrates a cross-sectional view of an exemplary semiconductor package structure 100a' in accordance with some embodiments of the disclosure. Descriptions of elements of the embodiments hereinafter that are the same as or similar to those previously described with reference to FIGS. 2B, 3, and 4A may be omitted for brevity. In the embodiment, the semiconductor package structure 100a' is similar to the semiconductor package structure 100 shown in FIGS. 3 and 4A. Compared to the semiconductor package structure 100a, the semiconductor package structure 100a' further includes a spacer 350 interposed between the IC die 400 and the memory die 300, as shown in FIG. 4B.

In some embodiments, the spacer 350 is a dummy die or a die having an RDL structure (not shown) that is coupled between the IC die 400 and the memory die 300. Moreover, the edges of the IC die 400 are not aligned to the edges of the spacer 350, as shown in FIG. 4B. For example, the edges of the IC die 400 laterally protrude from the edges of the spacer 350. As a result, the IC die 400 may provide spaces for bonding wires (not shown). Moreover, an edge of the spacer 350 may be aligned to an edge of the memory die 300. It should be noted that the planar arrangement of the spacer 350 is not limited to that disclosed in the embodiment.

In some embodiments, the semiconductor package structure 100a' may include an encapsulating layer (not shown), such as a molding compound, disposed on the package substrate 200 and surrounding the memory die 300, the spacer 350, and the overlying IC die 400.

According to the foregoing embodiments, as viewed from a top-view perspective, the first and second sensitive device regions of the RF circuit that is integrated into an SOC die are arranged to be spaced apart from the memory I/O electrical path of a memory die stacked above or below the SOC die. As a result, undesired signal coupling between the memory I/O electrical path and the sensitive device and/or routing in RF circuit can be eliminated or mitigated, thereby preventing RF desense and improving or maintaining RF performance. Moreover, since a metal plate connected to ground is disposed directly below the second sensitive device regions of the RF circuit, the metal plate can serve as a shielding layer so as to further eliminate or mitigate undesired signal coupling between the memory I/O electrical path and the sensitive device and/or routing in RF circuit.

Moreover, according to the foregoing embodiments, as viewed from a top-view perspective, a portion of RF circuit including the second sensitive device region is arranged to overlap the memory die stacked above or below the RF circuit. Accordingly, compared to cases where the RF circuit does not overlap the memory die, as viewed from a top-view perspective, a compact package size can be obtained.

Additionally, according to the foregoing embodiments, since a dummy die is interposed between the memory die and the IC die, the design flexibility of the wire's loop height for bonding wires in the semiconductor package structure can be increased.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a package substrate; and
   an integrated circuit (IC) die having a radio frequency (RF) circuit and a memory die stacked over the package substrate,
   wherein the memory die entirely covers a first surface portion of the package substrate to define a second surface portion of the package substrate exposed from the memory die and the IC die partially covers the first surface portion and the second surface portion of the package substrate; and
   wherein the RF circuit comprises a first sensitive device region corresponding to the second surface portion of the package substrate and a second sensitive device region corresponding to the first surface portion of the package substrate, and wherein the second sensitive device region is spaced apart from a memory input/output (I/O) electrical path of the memory die, as viewed from a top-view perspective.

2. The semiconductor package structure as claimed in claim 1, wherein the IC die is disposed over the memory die.

3. The semiconductor package structure as claimed in claim 2, further comprising a spacer interposed between the IC die and the memory die.

4. The semiconductor package structure as claimed in claim 3, wherein the spacer is a dummy die.

5. The semiconductor package structure as claimed in claim 4, wherein the spacer comprises a metal plate directly below the second sensitive device region of the RF circuit.

6. The semiconductor package structure as claimed in claim 5, wherein the metal plate is electrically connected to ground.

7. The semiconductor package structure as claimed in claim 3, wherein the spacer comprises a redistribution layer (RDL) structure that is coupled between the IC die and the memory die.

8. The semiconductor package structure as claimed in claim 3, wherein the memory die comprises a metal plate directly below the second sensitive device region of the RF circuit.

9. The semiconductor package structure as claimed in claim 8, wherein the metal plate is electrically connected to ground.

10. The semiconductor package structure as claimed in claim 2, wherein the memory die comprises a metal plate directly below the second sensitive device region of the RF circuit.

11. The semiconductor package structure as claimed in claim 10, wherein the metal plate is electrically connected to ground.

12. The semiconductor package structure as claimed in claim 1, wherein the memory die is disposed over the IC die.

13. The semiconductor package structure as claimed in claim 12, further comprising a spacer interposed between the IC die and the memory die.

14. The semiconductor package structure as claimed in claim 13, wherein the spacer is a dummy die.

15. The semiconductor package structure as claimed in claim 13, wherein the spacer comprises an RDL structure that is coupled between the IC die and the memory die.

16. The semiconductor package structure as claimed in claim 1, wherein the first sensitive device region comprises an RF transmitter and an RF receiver and the second sensitive device region comprises an RF synthesizer.

17. The semiconductor package structure as claimed in claim 16, wherein the first sensitive device region further comprises an RF balun and the second sensitive device region further comprises an RF inductor.

18. The semiconductor package structure as claimed in claim 1, wherein the first sensitive device region comprises an RF synthesizer and an RF receiver and the second sensitive device region comprises an RF transmitter.

19. The semiconductor package structure as claimed in claim 18, wherein the first sensitive device region further comprises an RF inductor and the second sensitive device region further comprises an RF balun.

20. The semiconductor package structure as claimed in claim 1, wherein the first sensitive device region comprises an RF receiver and the second sensitive device region comprises an RF transmitter and an RF synthesizer.

21. The semiconductor package structure as claimed in claim 20, wherein the second sensitive device region further comprises an RF balun and an RF inductor.

22. The semiconductor package structure as claimed in claim 1, wherein the first sensitive device region comprises an RF receiver, an RF transmitter, and an RF synthesizer.

23. The semiconductor package structure as claimed in claim 1, wherein the memory I/O electrical path comprises an RDL.

24. The semiconductor package structure as claimed in claim 1, wherein the second sensitive device region further corresponds to the second surface portion of the package substrate and is spaced apart from the first sensitive device region, as viewed from a top-view perspective.

25. The semiconductor package structure as claimed in claim 1, wherein the second surface portion of the package substrate has an interconnect region coupled to the first sensitive device region and the second sensitive device region, and wherein the first sensitive device region is between the interconnect region and the memory die, as viewed from a top-view perspective.

26. The semiconductor package structure as claimed in claim 1, wherein the second surface portion of the package substrate has an interconnect region coupled to the first sensitive device region and the second sensitive device region, and wherein at least a portion of the interconnect region is covered by the first sensitive device region, as viewed from a top-view perspective.

27. A semiconductor package structure, comprising:
   a package substrate; and
   an integrated circuit (IC) die having a radio frequency (RF) circuit and a memory die stacked over the package substrate,
   wherein the memory die is disposed over the IC die, and the memory die has a memory input/output (I/O) electrical path;
   wherein the memory die entirely covers a first surface portion of the package substrate to define a second surface portion of the package substrate exposed from the memory die; and
   wherein the RF circuit comprises a first sensitive device region corresponding to a second surface portion of the package substrate and a second sensitive device region corresponding to a first surface portion of the package substrate, and wherein the second sensitive device region is spaced apart from the memory input/output (I/O) electrical path of the memory die, as viewed from a top-view perspective.

28. A semiconductor package structure, comprising:
a package substrate; and
an integrated circuit (IC) die having a radio frequency (RF) circuit and a memory die stacked over the package substrate,
wherein the IC die is disposed over the memory die, and the memory die has a memory input/output (I/O) electrical path; and
wherein the RF circuit comprises a first sensitive device region corresponding to a second surface portion of the package substrate and a second sensitive device region corresponding to a first surface portion of the package substrate, and wherein the second sensitive device region is spaced apart from the memory input/output (I/O) electrical path of the memory die, as viewed from a top-view perspective.

* * * * *